United States Patent [19]
Brooks et al.

[11] Patent Number: 5,936,562
[45] Date of Patent: Aug. 10, 1999

[54] HIGH-SPEED SIGMA-DELTA ADCS

[75] Inventors: Todd L. Brooks, Boston; David Robertson, Boxford, both of Mass.

[73] Assignee: Analog Devices, Inc., Norwood, Mass.

[21] Appl. No.: 08/870,429

[22] Filed: Jun. 6, 1997

[51] Int. Cl.[6] .................................................. H03M 3/02
[52] U.S. Cl. ........................................ 341/143; 341/155
[58] Field of Search .................................. 341/143, 155, 341/200

[56] References Cited

U.S. PATENT DOCUMENTS

| | | | |
|---|---|---|---|
| 5,030,952 | 7/1991 | Ledzius et al. | 341/143 |
| 5,153,593 | 10/1992 | Walden et al. | 341/143 |
| 5,162,799 | 11/1992 | Tanimoto | 341/143 |
| 5,200,750 | 4/1993 | Fushiki et al. | 341/143 |
| 5,257,026 | 10/1993 | Thompson et al. | 341/118 |
| 5,274,374 | 12/1993 | Powell et al. | 341/143 |
| 5,274,375 | 12/1993 | Thompson | 341/143 |
| 5,305,004 | 4/1994 | Fattaruso | 341/120 |
| 5,329,282 | 7/1994 | Jackson | 341/143 |
| 5,369,403 | 11/1994 | Temes et al. | 341/143 |
| 5,404,142 | 4/1995 | Adams et al. | 341/144 |
| 5,406,283 | 4/1995 | Leung | 341/143 |
| 5,835,043 | 11/1998 | Tsuchida et al. | 341/143 |
| 5,838,272 | 11/1998 | Steiner et al. | 341/143 |
| 5,844,514 | 12/1998 | Ringh et al. | 341/143 |

OTHER PUBLICATIONS

"An Improved Sigm–Delta Modulator Architecture", T.C. Leslie et al., IEEE 1990 International Symposium on Circuits and Systems, pp. 372–375, vol. 1.

"Multibit Sigma–Delta Modulator With Reduced Sensitivity to DAC Nonlinearity", A. Hairapetian et al., Electronic Letters, vol. 27, No. 11, pp. 990–991.

"Improved Performance of Multi–Bit Delta–Sigma Analog to Digital Converters Via Requantization", F. Harris et al., 1991 IEEE International Symposium of Circuits and Systems, vol. 1, pp. 1629–1632.

"Architecture for Multi–Bit Oversampled A/CConverter Employing Dynamic Element Matching Techniques", B.H. Leung, 1991 IEEE International Symposium of Circuits and Systems, pp. 1657–1660, vol. 3.

"On the Performance of an Oversampled Analog to Digital Comverter with Digital Requantizer in Feedback Path", F. Harris et al., Internt'l Confer on Analogue to Digital & Digital to Analog Conversion, pp. 17–22.

"Multi–Bit Sigma–Delta A/D Converter Incorporating a Novel Class of Dynamic Element Matching Techniques", B.H. Leung et al., Trans of Circuits and Systems II, vol. 39, No. 1, pp. 35–51.

"Sigma–Delta Modulators with Multibit Quantising Elements and Single–Bit Feedback", T.C. Leslie et al., IEE Proceedings G (Circuits, Devices and Systems), vol. 139, No. 3, pp. 356–362.

"A Dual–Quantization Multi–Bit Sigma Delta Analog/Digital Converter", A. Hairapetian et al., 1994 IEEE International Symposium on Circuits & Systems, pp. 437–440.

"Delta–Sigma Data Converters", Theory, Design and Simulation, Edited by S. R. Norsworthy et al., IEEE Press, Circuits & Systems Society, pp. 273–281.

"Oversampling Delta–Sigma Data Converters", Theory, Design and Simulation, J.C. Candy et al., IEEE Press, Circuits and Systems Society, pp. 1–29.

*Primary Examiner*—Marc S. Hoff
*Assistant Examiner*—Peguy JeanPierre
*Attorney, Agent, or Firm*—Wolf, Greenfield & Sacks, P.C.

[57] ABSTRACT

An ADC system includes a sigma-delta modulator that receives an analog input and provides a first digital output and an analog output. An ADC, coupled to the sigma-delta modulator, receives the analog output as an input and provides a second digital output. A digital processor, coupled to the sigma-delta modulator and the ADC, receives the first and second digital outputs and provides a digital representation of the analog input.

13 Claims, 7 Drawing Sheets

HIGH-SPEED SIGMA-DELTA ADCS

FIELD OF THE INVENTION

The present invention relates generally to analog-to-digital converters (ADCs) and, more particularly, to a sigma-delta converter having wide bandwidth and dynamic range.

BACKGROUND OF THE INVENTION

ADCs have widespread use in the field of communications and in audio, video and multimedia electronics. Much effort has been directed at improving the speed, accuracy and simplicity of ADCs.

Sigma-delta converters recently have come into widespread use. With relatively simple circuitry, sigma-delta converters achieve high accuracy. Sigma-delta technology employs oversampling-sampling at a rate greater than the Nyquist rate such that a majority of quantization noise (caused during conversion) is shifted to a frequency band greater than the signal bandwidth. The shift enables subsequent filtering of the noise. Sigma-delta technology thus enables high signal-to-noise ratios (SNRs). It also is compatible with CMOS processes.

In certain applications, such as multi-tone communications applications, for example, a need exists for ADCs with high accuracy (wide dynamic range) and high speed (wide bandwidth). To date, an ADC exhibiting wide dynamic range (e.g., >80 dB) and wide bandwidth (e.g., >200 kHz) has been difficult to achieve without employing complex and expensive circuitry.

Sigma-delta converters, by using oversampling techniques, typically exhibit wide dynamic range at the expense of limited bandwidth. Conversely, pipeline ADCs typically achieve wide bandwidth, but have limited dynamic range.

FIG. 1 is a block diagram showing a conventional pipeline converter including multiple stages S1, S2 and S3 cascade-connected together. Stages S1 and S2 consist of an ADC, a digital to-analog converter (DAC), and a subsequent residue amplifier (labeled AMP). These two stages of the pipeline provide an analog-to-digital conversion of the signal at the input of the stage and also provide an analog residue signal to the following stage. The last stage of the pipeline, stage S3, does not need to generate an analog residue signal to be used by a subsequent stage. Consequently stage S3 consists of a single ADC and does not include a DAC or a residue amplifier.

The first stage S1 consists of ADC1, DAC1, and AMP1. ADC1 receives an analog input voltage Vin and converts the input voltage to a digital code. DAC1 receives the digital code from ADC1 and converts this digital code back into an analog signal. AMP1 amplifies the difference between Vin and the analog signal at the output of DAC1 to provide an analog residue signal to the input of subsequent stage S2. The digital code from ADC1 also is provided to a digital pipeline correction logic block 10.

Stage S2 consists of ADC2, DAC2, and AMP2. ADC2 receives an input analog residue from stage S1 and converts the residue to a digital code. DAC2 receives the digital code from ADC2 and converts this digital code back into an analog signal. AMP2 amplifies the difference between the input analog residue signal and the analog signal at the output of DAC2 to provide an output analog residue signal to the input of subsequent stage S3. The digital code also is provided to logic 10. Stage S3 consists of ADC3. ADC3 receives an input analog residue from stage S2 and converts the residue to a digital code. Logic 10 time-aligns the digital codes from each stage and provides a digital output, representative of the analog input voltage Vin.

While each stage of the three-stage pipeline converter shown in FIG. 1 includes an ADC and may also include a DAC and an AMP, other circuit arrangements for each stage are known. For example, the AMP could be replaced by a sample-and-hold circuit. Alternatively, the residue amplification stage (the portion of each stage not including the ADC) could include a DAC, a differencer (adder/subtracter) and a residue amplifier.

The conversion rate of a pipeline converter, equal to the conversion time of a single stage of the pipeline, may be made very fast. The overall conversion time (required to process a single input sample), however, is equal to the sum of the conversion times of all of the stages. Consequently, typically there is a delay of several clock cycles from input to output of the pipeline converter. Additionally, the linearity of such converters is limited by element matching and inter-stage gain errors.

FIG. 2 is a block diagram showing a conventional single-bit sigma-delta ADC. As shown, the converter consists of an adder/subtractor 12, a loop filter 14, a one-bit ADC 16, a digital filter 20 and a one-bit DAC 18. An input is received by adder/subtractor 12 from which an error (provided by DAC 18) is subtracted. Loop filter 14 filters the difference and one-bit ADC 16 converts this signal to a digital signal. Errors are provided through the feedback path and converted by DAC 18. Digital filter 20 filters digital output samples to reduce quantization noise.

Such single-bit implementations are tolerant of element mismatch; linearity of the single-bit DAC circuitry in the modulator feedback loop is unaffected by element matching inaccuracy. A disadvantage associated with single-bit sigma-delta converters is that a large quantization error is produced by the single-bit quantizer (one-bit ADC 16) in the modulator loop. This degrades resolution and accuracy. Thus, high oversampling ratios (OSRs), typically 64 times or greater, are required to obtain wide dynamic range.

Higher-order modulator loops provide greater attenuation of noise within the signal bandwidth. High-order loops, however, are implemented at the expense of greater complexity and of reduced loop stability.

To increase the available signal bandwidth of sigma-delta modulators, either the sample rate of the modulator may be increased or the OSR may be reduced. Increased sample rates results in increased power consumption. Decreasing the OSR, on the other hand, directly reduces the improvements (such as reduced noise performance) obtained through oversampling.

To reduce the OSR while maintaining a given level of noise performance, it is necessary to provide additional reduction of in-band quantization noise. This may be achieved either through the use of a higher-order noise-shaping transfer function or through the use of increased quantizer resolution in a multi-bit sigma-delta modulator. The later option is preferable at low OSRs. Increased quantizer resolution results in a reduction of quantization noise throughout the entire spectrum. Higher-order noise-shaping transfer functions, on the other hand, provide reduction of quantization noise energy only within the signal bandwidth, and at low OSRs, they become less efficient at reducing in-band quantization noise.

The overall noise energy at the output of a modulator does not decrease with higher-order modulator loops. Higher-order noise-shaping transfer functions transfer more of the noise energy out-of-band where it may be reduced through digital filtering downstream of the modulator. For single-bit modulators operating at very low OSRs, the improvement (reduction) of in-band quantization noise is small as the loop order is increased. In contrast, the quantization noise of a multi-bit quantizer decreases greatly, at a rate of 6 dB per each additional bit of quantizer resolution, independent of the OSR or loop order.

One prior art approach aimed at reducing quantization noise is the so-called Mash sigma-delta architecture. Such an approach reduces quantization noise by increasing the order of the noise-shaping transfer function through the use of multiple modulator stages connected together (in a semi-cascade arrangement). An example of a Mash architecture is described in *Oversampling Methods for A/D and D/A Conversion* by Candy and Temes, which paper is herein incorporated by reference in its entirety.

In a Mash architecture, quantization errors of each modulator stage are processed in a following stage. Digital outputs of the stages are filtered and combined with outputs of previous stages in an attempt to cancel (or greatly reduce) the quantization errors of previous stages. Consequently, the quantization errors of all but the final stage in the Mash architecture are reduced in the combined digital output of the entire converter. A high-order noise-shaping transfer function may be achieved to maintain the quantization errors low in this final stage.

The advantage of the Mash architecture is that effectively, a high-order noise-shaping transfer function is achieved without employing a high-order loop. Rather, a multitude of independent low-order loops are connected to one another for this purpose. Stability problems associated with high-order loops therefore are avoided.

One disadvantage of the Mash architecture is that it is quite sensitive to matching accuracy of analog and digital processing circuits. Inaccuracies in analog element values (due, for examples, to manufacturing tolerance and to variations in temperature) cause errors in the analog modulator noise-shaping transfer functions. Mismatches result in improper cancellation or leakage of the quantization errors from the stages preceding the final stage of the converter into the digital output.

Matching accuracy becomes a more limiting problem as the overall order of the noise-shaping transfer function is increased in a Mash architecture through increasing the number of low-order stages. This results in smaller in-band quantization error energy associated with the final stage and, therefore, the output noise is more likely to be limited by imperfect cancellation of quantization errors in earlier stages.

Another approach at reducing quantization noise includes multi-bit sigma-delta converters. It has been shown that quantization noise may be reduced by approximately 6 dB per each additional bit of resolution in the quantizer. This reduction of noise with a multi-bit implementation is obtained without any corresponding increase in the OSR or loop order. Multi-bit techniques may be used to achieve a desired level of noise performance with a given (typically relatively low) OSR. Wide-bandwith sigma-delta converters commonly use the multi-bit approach to reduce oversampling requirements and thereby enable higher speed operation.

The multi-bit approach, however, suffers from serious drawbacks. It requires linear, accurate DAC circuitry in order to obtain high linearity and accuracy in the sigma-delta ADC. Errors in the DAC circuitry appear directly in the output code of the modulator. Consequently, the DAC circuitry must be as linear as that of the overall sigma-delta.

The stringent requirement of DAC linearity is difficult to achieve for most applications. Consequently, the performance of many prior art multi-bit sigma-delta ADCs is limited by the accuracy of the feedback DAC circuitry.

Truncation feedback multi-bit sigma-delta architecture is an approach that avoids the requirement of having a linear multi-bit DAC in the modulator loop. Such a truncated feedback multi-bit approach is described, for example, in *An Improved Sigma-Delta Modulator Architecture* by Leslie and Singh, which paper is herein incorporated by reference in its entirety.

This prior art approach uses a multi-bit quantizer and feeds only the most-significant bit (MSB) of the quantizer back in the modulator feedback loop. The n-bit digital output of the quantizer is divided into a one-bit MSB feedback signal and a separate n-1 bit feedforward signal, formed by the least-significant bits (LSBs) output by the quantizer. The LSBs are processed digitally and combined with the MSB in an attempt to cancel (or greatly reduce) the quantization error of the MSB signal, thereby improving the noise performance of the converter.

The digital signal provided with the LSBs provides a digital estimate of the single-bit quantization error of the MSB. To achieve cancellation (significant reduction) of the MSB quantization error, the LSBs are filtered using a digital filter having a digital transfer function that approximates the modulator noise-shaping transfer function. The LSBs, however, are limited in precision by the resolution and accuracy of the multi-bit quantizer. Consequently, the LSBs do not provide a perfect estimate of the large quantization error of the single-bit MSB.

The combined digital output signal of the truncation feedback arrangement provides a signal-to-noise ratio which is comparable to that of a conventional n-bit sigma-delta modulator but without incurring the non-linearity problems of a multi-bit feedback DAC.

A drawback of the truncation feedback architecture is that it suffers from the same sensitivity to matching of analog and digital transfer functions as does the Mash ADC architecture, described above. In order to fully cancel the quantization error in the MSB bit, the analog modulator noise-shaping transfer function must match (be an exact analog equivalent of) the transfer function of the digital filter used to process the LSB data. Inaccuracies in analog element values due to manufacturing tolerances and to variations in temperature typically result in an inaccurate modulator noise-shaping transfer function. This results in leakage of the MSB quantization error into the output of the converter. The noise performance therefore may be limited by matching accuracy. This becomes a greater problem when truncation feedback is used with a high-resolution quantizer. Increased quantizer resolution and accuracy results in a corresponding reduction of LSB quantization errors. As such, the noise is more dominated by leakage of the MSB quantization error.

Recent efforts to linearize multi-bit DAC circuitry have enabled new levels of performance by sigma-delta converters. As a result of this work, multi-bit sigma-delta converters are no longer necessarily limited by DAC linearity. Another constraint limiting the achievable performance of multi-bit sigma-delta ADCs, however, is a practical limit to resolution of the quantizer.

The noise reduction achieved with a multi-bit sigma-delta implementation depends on the number of bits in the quantizer. A large number of bits in the quantizer reduces the quantization noise. In order to obtain a large number of quantization bits, however, high resolution ADC and DAC converter circuitry must be employed in the modulator loop. This circuitry must be capable of quickly converting the analog and digital data. Any delays in the modulator loop must be small enough to avoid destabilizing the loop and degrading the filtering of in-band quantization noise.

A multi-bit quantizer implementation having a relatively fast conversion time includes the flash architecture. Unfortunately, the number of comparators in this architecture grows exponentially as the number of bits is increased. As such, the flash architecture is undesirable for use in high-resolution quantizers because the size and power of the ADC implementation doubles for each additional bit of resolution. Alternative quantizer implementations may provide more efficient circuit implementations at the expense of requiring increased conversion time (the overall length of time required to convert the signal). Such ADC circuit implementations typically are made efficient through repetitive processing of the analog signal. Conversion time with such implementations is inherently larger than that of a single flash ADC because several steps are required to obtain the final answer, as described above with reference to the pipeline converter shown in FIG. 1.

Practical implementations of flash ADCs commonly are limited to a maximum of five to eight bits. Therefore, multi-bit sigma-delta ADC implementations also typically are limited to quantizer resolutions of less than eight bits. This limits the minimum value of the OSR that can be used with a multi-bit sigma-delta ADC to achieve a given level of noise performance. OSRs in the range of 32× to 128× typically are used with multi-bit sigma-delta ADCs.

It is a general object of the present invention to provide a high speed, high accuracy ADC that avoids the drawbacks of the prior art.

SUMMARY OF THE INVENTION

An embodiment of the present invention is directed to an ADC system. The ADC system includes a sigma-delta modulator that receives an analog input and provides a first digital output and an analog output. A non-sigma-delta ADC, coupled to the sigma-delta modulator, receives the analog output as an input and provides a second digital output. A digital processor, coupled to the sigma-delta modulator and the non-sigma-delta ADC, receives the first and second digital outputs and provides a digital representation of the analog input.

In an embodiment of the invention, the sigma-delta modulator includes a quantizer ADC.

In an embodiment of the invention, the non-sigma-delta ADC has a throughput delay greater than that of the quantizer ADC. In one embodiment of the invention, the non-sigma-delta ADC includes a pipeline ADC.

In an embodiment of the invention, the sigma-delta modulator includes a multi-bit feedback loop. In one embodiment, the sigma-delta modulator further includes a digital data scrambler in the multi-bit feedback loop.

In an embodiment, the digital processor includes a digital combiner that combines two digital signals equal to, or derived from, the first and second digital outputs.

In an embodiment of the invention, the digital processor includes a digital filter having a transfer function with at least one term that approximates an analog transfer function of the sigma-delta modulator.

The features and advantages of the present invention will be more readily understood and apparent from the following detailed description of the invention, which should be read in conjunction with the accompanying drawings and from the claims which are appended to the end of the detailed description.

The features and advantages of the present invention will be more readily understood and apparent from the following detailed description of the invention, which should be read in conjunction with the accompanying drawings and from the claims which are appended to the end of the detailed description.

BRIEF DESCRIPTION OF THE DRAWINGS

For a better understanding of the present invention, reference is made to the accompanying drawings, which are incorporated herein by reference and in which.

DETAILED DESCRIPTION

Figure 1:
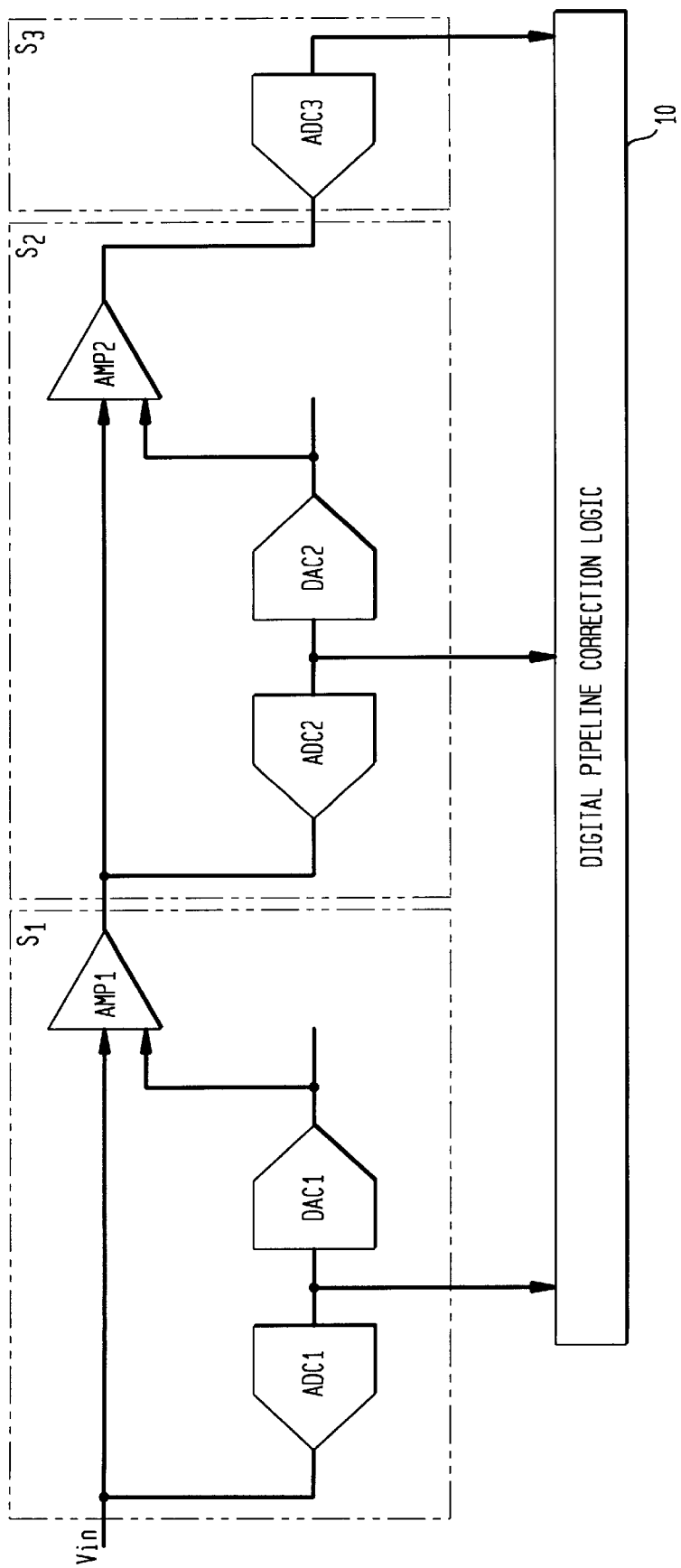
FIG. 1 is a block diagram of a conventional pipeline A/D converter.
Figure 2:
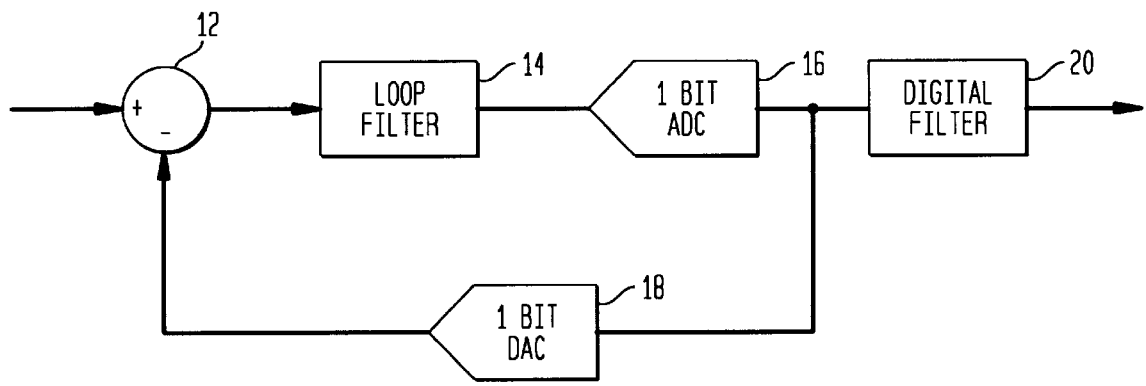
FIG. 2 is a block diagram of a conventional one-bit sigma-delta A/D converter.
Figure 3:
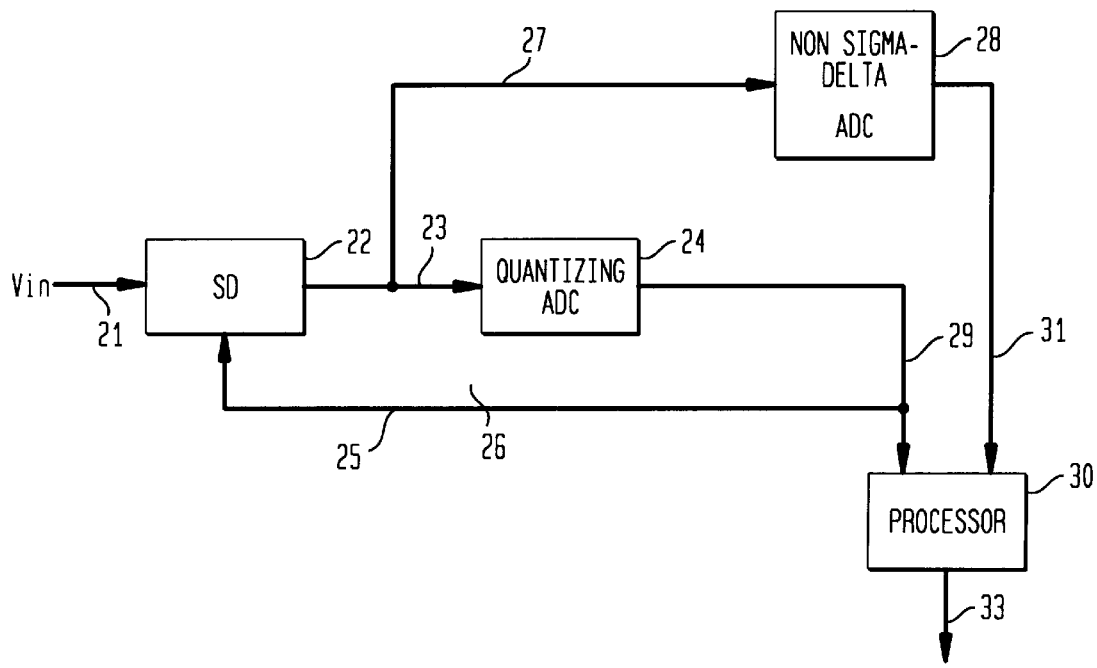
FIG. 3 is a general block diagram of one embodiment of an ADC system according to the invention.

FIG. 3 is a general block diagram of one embodiment of the ADC system according to the present invention. As shown, the system includes a sigma-delta modulator 26 and a non-sigma-delta ADC 28. The sigma-delta modulator 26 includes a sigma-delta block (labeled SD) 22 and a quantizing ADC 24. SD 22 receives an analog input voltage Vin on line 21 and a digital feedback signal on bus 25. SD 22 outputs on line 23 an analog filtered version of the analog input voltage and the digital feedback signal to quantizing ADC 24 which converts the signal to a digital signal (i.e., quantizes that signal) and provides the digital signal on bus 29 and feedback bus 25. The quantizing ADC 24 adds quantization noise Q that is fed back through SD 22 and filtered.

The quantizing ADC 24 should have low throughput delay because it is in the modulator loop. In a typical implementation, the throughput delay of quantizing ADC 24 is less than or equal to 1/Fs, where Fs is the sample rate of sigma-delta modulator 26. Quantizing ADC 24 may, for example, include a flash converter, a two-step converter, or any other ADC implementation that provides low throughput delay. SD 22 may be any circuit that receives an analog signal and a digital signal as inputs, and provides an analog output signal that is a filtered version of the analog and digital inputs.

The analog signal output from SD 22 is provided on line 27 to non-sigma-delta ADC 28 which converts the analog signal to a digital signal and provides that digital signal on bus 31. Non-sigma-delta ADC 28 requires higher accuracy than quantizing ADC 24 but the throughput delay can be greater. The non-sigma-delta ADC 28, however, requires the same conversion rate as quantizing ADC 24.

Additionally, non-sigma-delta ADC 28 may be any ADC that does not use sigma-delta feedback techniques. In other words, ADC 28 does not feedback previous samples of the converter to reduce quantization noise, as does a sigma-delta modulator. Non-sigma-delta ADC 28 may, for example, include a pipeline ADC, a sub-ranging ADC, a parallel time-interleaved ADC, a folding ADC, an interpolating ADC, a flash ADC, a two-step ADC, a successive-approximation ADC, an integrating ADC, or any other ADC implementation which does not use sigma-delta feedback techniques.

At any one time, the digital signal output by quantizing ADC 24 on bus 29 includes an additional component of quantization error, Q, not present in the signal at the output of the non-sigma-delta ADC 28 on bus 31. Processor 30 is a digital processor that filters at least the digital signal received on bus 31. Processor 30 has a transfer function with at least one element that approximates an analog transfer function of sigma-delta modulator loop 26. Processor 30 also combines the filtered signal with the digital signal received on bus 29 in an attempt to output a digital signal representing analog input signal Vin. Processor 30 attempts to effectively cancel the component of quantization error, Q, provided by quantizing ADC 24.

The idea behind this invention is that each of the digital outputs (provided by quantizing ADC 24 and non-sigma-delta ADC 28) includes two variables: the input signal Vin and the quantization error Q of quantizing ADC 24. Thus, digital processor 30 should be able to solve for one of the two variables, Vin.

It should be understood that the system faces the following constraints. First, the analog transfer function of sigma-delta modulator loop 26 is not known precisely. Thus, digital processor 30 can only approximate the value of that transfer function. Therefore, processor 30 cannot solve for Vin perfectly. Additionally, non-sigma-delta ADC 28 is not ideal. It has its own errors and noise that it injects into the system and that are present in the final output, as explained in more detail below.

An advantage of the system is that the digital output has a much higher signal-to-noise ratio than that of a straight sigma-delta modulator. This is because non-sigma-delta ADC 28 has higher resolution and accuracy than quantizing ADC 24 and therefore the errors and noise associated with ADC 28 are much less than the quantization noise Q associated with quantizing ADC 24.

Another advantage of the system is that because non-sigma-delta ADC 28 is outside of sigma-delta modulator loop 26, long delays through ADC 28 can be tolerated. That is, while non-sigma-delta ADC 28 is required to have a conversion rate equal to Fs, it may have a throughput delay which is much larger than 1/Fs. For this reason, an efficient ADC architecture which takes advantage of the relaxed requirements for throughput delay may be used to implement non-sigma-delta ADC 28. Examples of efficient ADC architectures which provide fast conversion rates but with long throughput delays, and are therefore well-suited for use in implementing non-sigma-delta ADC 28, include pipeline ADCs and parallel time interleaved ADCs.

Figure 4:
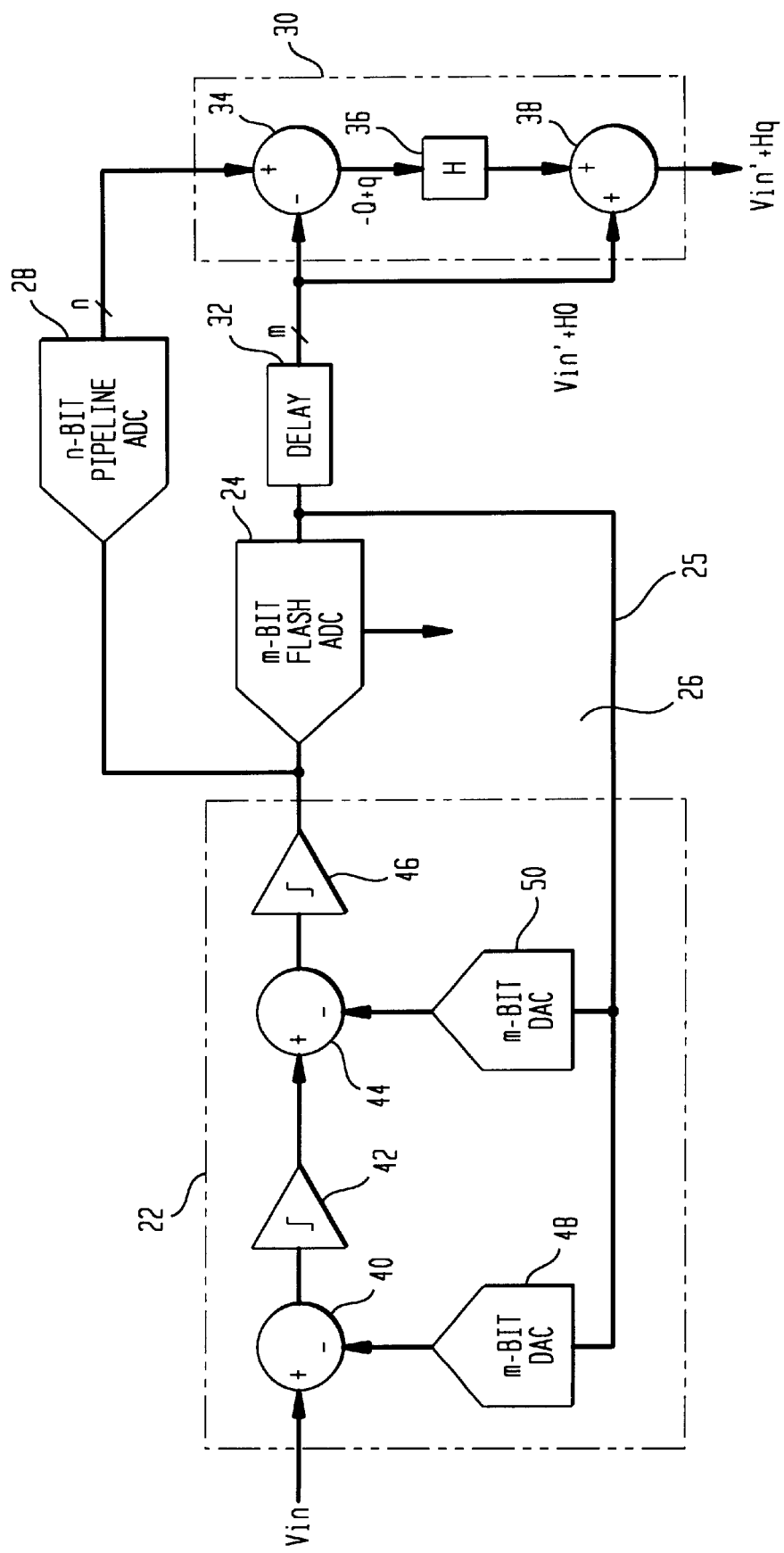
FIG. 4 is a more detailed block diagram of an embodiment of the ADC system according to the invention.

FIG. 4 is a more detailed block diagram of an embodiment of the ADC system of the invention. As shown, like FIG. 3, the system includes a sigma-delta modulator 26, itself including an SD 22 and quantizing ADC 24. The system also includes a non-sigma-delta ADC 28 and processor 30. In this embodiment, SD 22 includes the analog DAC and filter circuitry of a second-order loop. Quantizing ADC 24 includes an m-bit flash ADC, wherein m is greater than or equal to one. Non-sigma-delta ADC 28 includes an n-bit pipeline ADC where n is greater than or equal to one.

SD 22 includes two m-bit DACs 48 and 50, two adder/subtractors (also referred to as "differencers" or "combiners") 40 and 44, and two integrators 42 and 46. The digital output signal from flash ADC 24 is provided on bus 25 to DACs 48 and 50. DAC 48 converts the feedback signal to an analog signal, which is subtracted from the input signal Vin by adder/subtractor 40. The difference is provided to integrator 42, which integrates the difference signal and provides the integrated difference to adder/subtractor 44. DAC 50 converts the feedback signal to an analog signal, which is subtracted from the integrated difference signal by adder/subtractor 44. The difference is provided to integrator 46, which provides an integrated output to flash ADC 24 and pipeline ADC 28. Each DAC/integrator combination may be implemented using a fully differential switched-capacitor circuit. In addition, SD 22 may be implemented with unity DAC and integrator gains to minimize the noise contribution of DAC 50 and integrator 46, which may be significant at low OSRs (i.e., 8×).

Flash ADC 24 converts (quantizes) the analog signal to a digital signal and adds quantization noise in the process. The digital signal output by flash ADC 24 also is provided through delay element 32 to account for the greater delay through pipeline ADC 28 such that the signals output by pipeline ADC 28 and delay circuit 32 will be in sync temporally.

Pipeline ADC 28 converts the analog signal provided by SD 22 to a digital signal and provides the digital signal to processor 30. The digital signal output by flash ADC 24 is subtracted from the a digital signal output from pipeline ADC 28 by adder/subtractor 34. The difference is equal to $-Q+q$, where Q is equal to the m-bit quantization error of m-bit flash ADC 24 and q is equal to the n-bit quantization error of n-bit pipeline ADC 28.

The difference signal $-Q+q$ is provided to digital filter 36, having a transfer function H which ideally is the digital equivalent of the analog error transfer function of sigma-delta modulator loop 26. That is, filter 36 provides a digital approximation of the modulator transfer function for errors (i.e. quantization noise) produced in ADC 24. The filtered signal is provided to adder 38. The digital signal output by flash ADC 24, equal to Vin'+HQ (wherein Vin' is a delayed version of Vin), also is provided to adder 38. The signals are added together by adder 38, which effectively cancels quantization error Q, assuming filter 36 perfectly approximates the analog transfer function of the sigma-delta modulator loop.

The sum Vin'+Hq is output by processor 30. While this output includes a noise term Hq, it should be understood that noise term q is much less than noise term Q.

While processor 30 in this embodiment was shown as including two digital adders/subtractors and one digital filter, the invention is not so limited. It is envisioned that processor 30 could include any number and combinations of digital filters and digital adders/subtractors. What is important is that the two digital signals output from ADC 28 and ADC 24 are in some way processed digitally such that quantization error Q is reduced significantly (as much as possible given the transfer function approximation) and a digital representation of analog input signal Vin, having as little a noise component as possible, is output.

Figure 5:
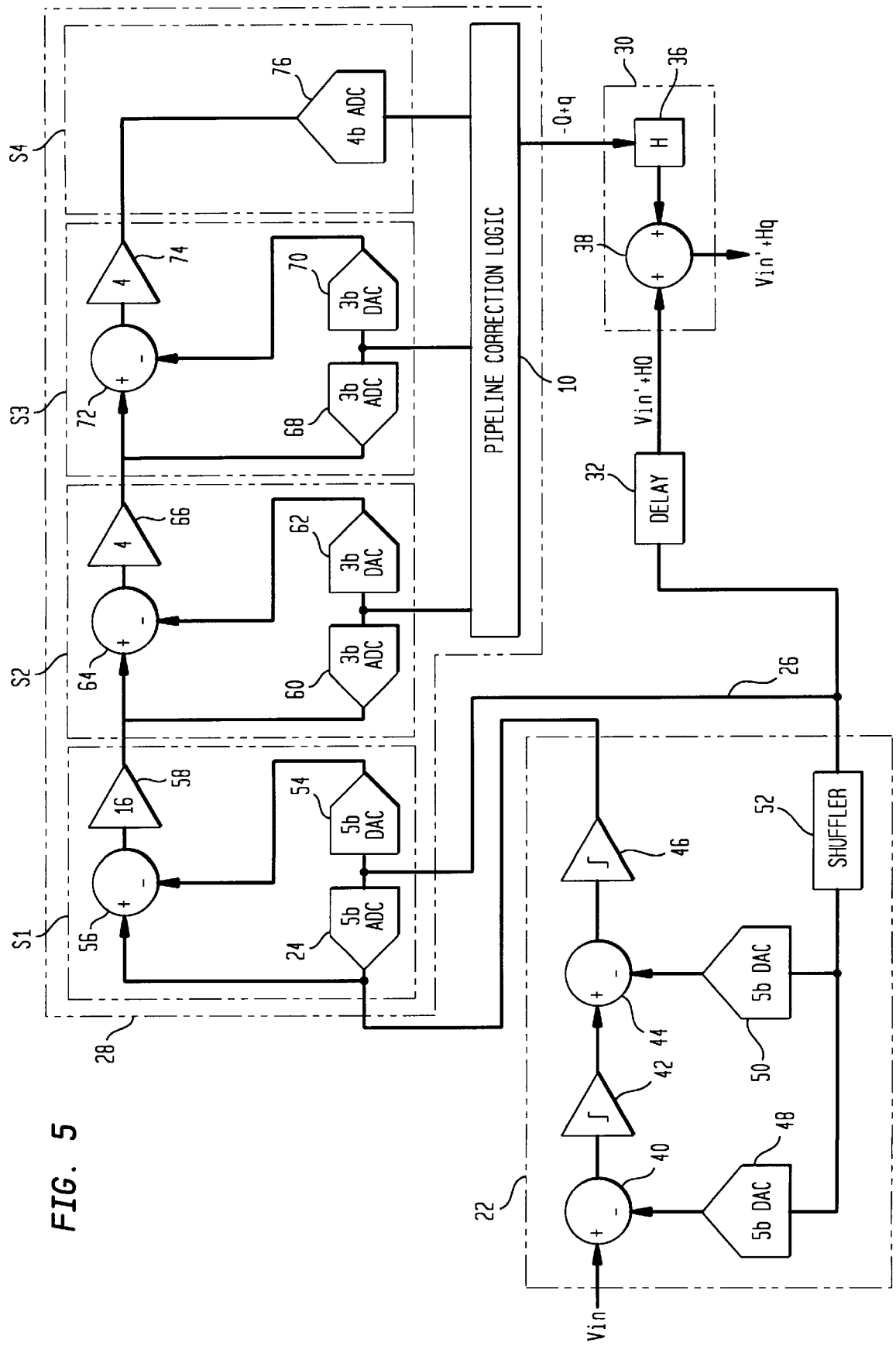
FIG. 5 is a detailed block diagram of a particular embodiment of the ADC system, modified from that shown in FIG. 4.

FIG. 5 is a more detailed block diagram of a particular embodiment of the ADC system of the invention. The system includes sigma-delta modulator 26, itself including SD 22 and flash ADC 24. Also included are pipeline ADC 28 and processor 30.

In this embodiment, quantizing ADC 24 is a 5-bit flash ADC and non-sigma-delta ADC 28 is a 12-bit pipeline ADC. Sigma-delta modulator 26 operates similarly to that described with reference to FIG. 4 except that it also includes a data scrambler or shuffler 52 in the feedback loop thereof. Shuffler 52 is employed when the sigma-delta modulator loop is a multi-bit loop (m>1). Its function and operation will be described in greater detail below.

The embodiment of FIG. 5 offers some advantages over that shown in FIG. 4. First, in addition to operating as part of sigma-delta modulator 26, flash ADC 24 also operates as part of the first stage S1 of the four-stage pipeline converter 28. Additionally, one less adder/subtractor is included in processor 30. This is so because analog adder/subtractor 56 performs an analogous operation to digital adder/subtractor 34 employed in processor 30 of the embodiment of FIG. 4.

The 12-bit pipeline converter 28, in this embodiment, includes four stages S1, S2, S3 and S4. Stage S1 includes 5-bit flash ADC 24, 5-bit DAC 54, adder/subtractor 56, and amplifier 58, having a gain of 16 in this embodiment. Stage S2 includes 3-bit ADC 60, 3-bit DAC 52, adder/subtractor 64, and amplifier 66, having a gain of four in this embodiment. Stage S3 includes 3-bit ADC 68, 3-bit DAC 70, adder/subtractor 72, and amplifier 74, having a gain of four in this embodiment. Stage S4 is composed of 4-bit ADC 76. The digital outputs of stages S2, S3, and S4 are provided to pipeline correction logic 10. The digital output of flash ADC 24 is provided to delay element 32. The digital signal output by pipeline correction logic 10, equal to −Q+q, is the same as that output from adder/subtractor 34 in the embodiment of FIG. 4.

Filter 36 receives the digital signal output by pipeline correction logic 10 and filters that digital signal. Like the embodiment of FIG. 4, filter 36 has a transfer function with at least one term H that approximates the analog error transfer function of sigma-delta modulator loop 26. The filtered signal is provided to adder 38. Additionally, the signal output from delay element 32, equal to Vin'+HQ, is provided to adder 38. The sum, Vin'+Hq, is output by processor 30.

In the embodiment shown in FIG. 5, the quantization error has been reduced from Q (at the output of 5-bit sigma-delta modulator loop 26) to small q (at the output of the ADC system), where Q is the quantization noise of 5-bit flash ADC 24 and q is the quantization noise of 12-bit pipeline converter 28. Thus, approximately 12-bit sigma-delta noise performance is achieved using a 5-bit sigma-delta modulator. Additionally, in the embodiment of FIG. 5, the OSR can be reduced to 8× (i.e. 8× decimation filters applied to the ADC digital output data) while maintaining a signal-to-quantization-noise performance of>100 dB in the filtered output data. Because the fast conversion rate of a 12-bit pipeline converter is combined with the wide dynamic range of a second-order, multi-bit sigma-delta modulator, the resulting converter can simultaneously achieve a 20 MHz sampling rate, 1.25 MHz signal bandwith, and 16-bit resolution, and which is fully implementable with conventional CMOS processing.

Figure 6:
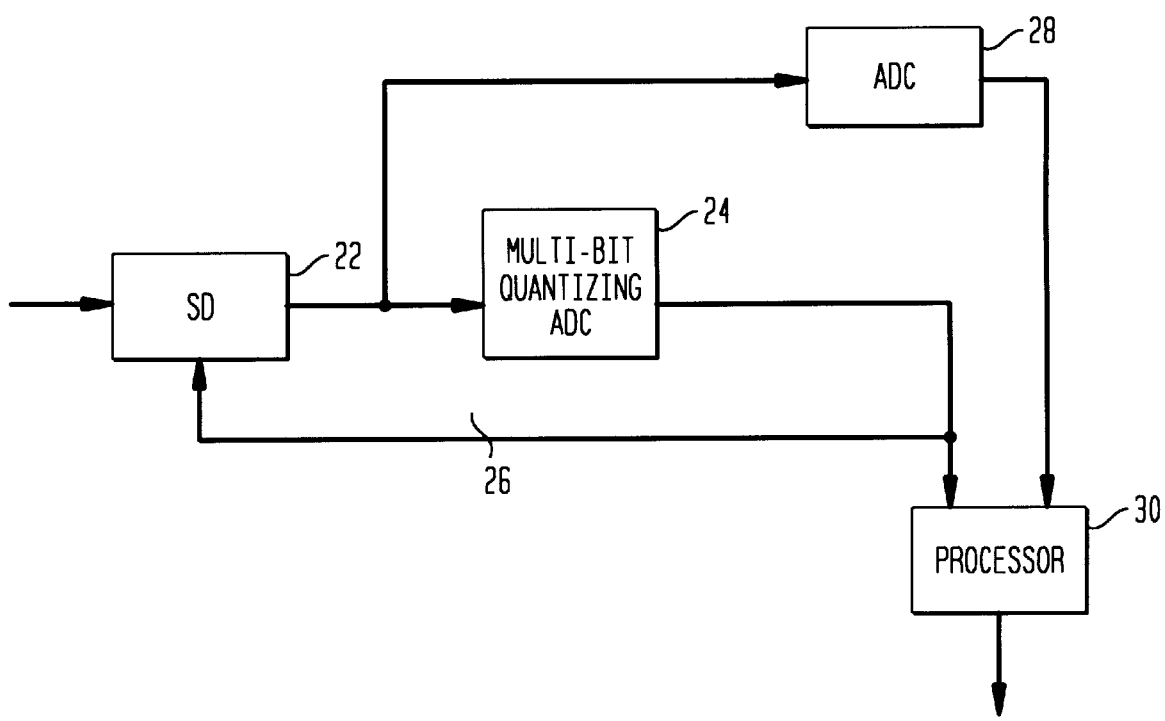
FIG. 6 is a general block diagram of another embodiment of the ADC system according to the invention.

FIG. 6 is a general block diagram of another embodiment of the ADC system of the invention. Like the embodiment shown in FIG. 3, the system includes a sigma-delta modulator 26, an ADC 28 and a processor 30. The sigma-delta modulator 26 includes an SD 22 and a quantizing ADC 24. Unlike the system of FIG. 3 in which the quantizing ADC 24 may be any number of bits, quantizing ADC 24 in the system of FIG. 6 is a multi-bit quantizing ADC. Also, unlike the system of FIG. 3 in which ADC 28 is a non-sigma-delta ADC, ADC 28 of FIG. 6 may be any ADC.

Figure 7:
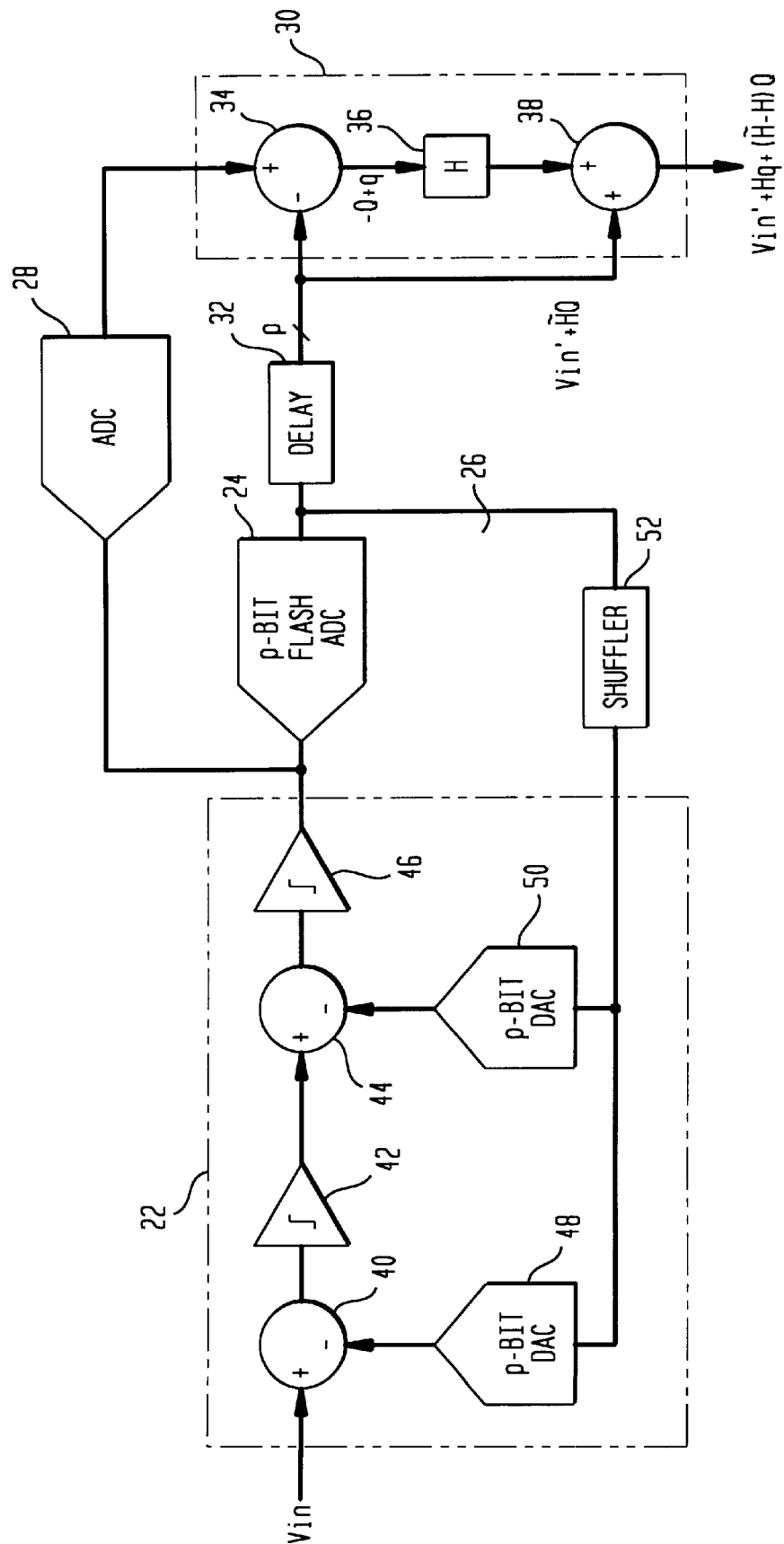
FIG. 7 is a more detailed block diagram of an embodiment of the ADC system according to the invention.

FIG. 7 is a more detailed block diagram of an embodiment of the ADC system shown in FIG. 6. As shown, the system includes p-bit sigma-delta modulator 26, itself including SD 22 and p-bit flash ADC 24, where p is greater than one. Also included is ADC 28, delay element 32 and processor 30. The system operates similarly to that described above. The p-bit digital signal output by flash ADC 24 is equal to Vin'+H'Q, wherein H' represents the analog error transfer function of the sigma-delta modulator 26. Quantizer errors in flash ADC 24 are filtered by the analog error transfer function H'.

Digital filter 36 of processor 30 has a transfer function H, where H is a digital approximation of analog error transfer function H'. Thus, the signal output by processor 30 is equal to Vin'+H'q+(H'−H)Q. This output shown in FIG. 7 accurately depicts that analog error transfer function H' can not be precisely predicted, due to practical analog inaccuracies (e.g. random values of operational parameters of analog circuit components) in the circuitry used to implement sigma-delta modulator 26, and consequently digital processor 30 can only approximate digitally (H) the analog error transfer function H'. Thus, a portion of the quantization noise Q of p-bit flash ADC 24 leaks through to the output, that portion being equal to the difference between the actual analog error transfer function H' of sigma-delta modulator 26 and the approximated digital transfer function H.

It is advantageous to employ a multi-bit sigma-delta modulator 26 in the system of the invention so that quantization error Q is minimized. By using more than one bit in the feedback loop of sigma-delta modulator 26 the amplitude of Q is reduced (as compared with a single-bit modulator) and consequently the sensitivity of the overall performance to errors in H' (i.e. to mismatches between H and H') is also reduced. That is, by using a multi-bit modulator the resulting ADC system achieves higher noise performance (less leakage of Q to the output through the term (H'−H)Q ) with practical analog inaccuracies in the circuitry used to implement sigma-delta modulator 26.

When using a multi-bit sigma-delta modulator loop, shuffler 52 should be employed. Shuffler 52 decorrelates element mismatch errors in the DACs 48 and 50 within the loop from input voltage Vin, thereby avoiding distortion problems common in multi-bit sigma-delta modulators. Shuffler 52 may also noise shape (filter) the mismatch errors to decrease the component of in-band noise caused by these errors. An exemplary shuffler circuit 52 available for use in the system of the present invention is described in co-pending application entitled "Self-Linearizing Multi-Bit DACs", assigned to the same assignee as herein, filed of even date herewith, invented by David Robertson, Anthony Del Muro, Steve Harston and Todd L. Brooks, which application is herein incorporated by reference in its entirety.

Figure 8:
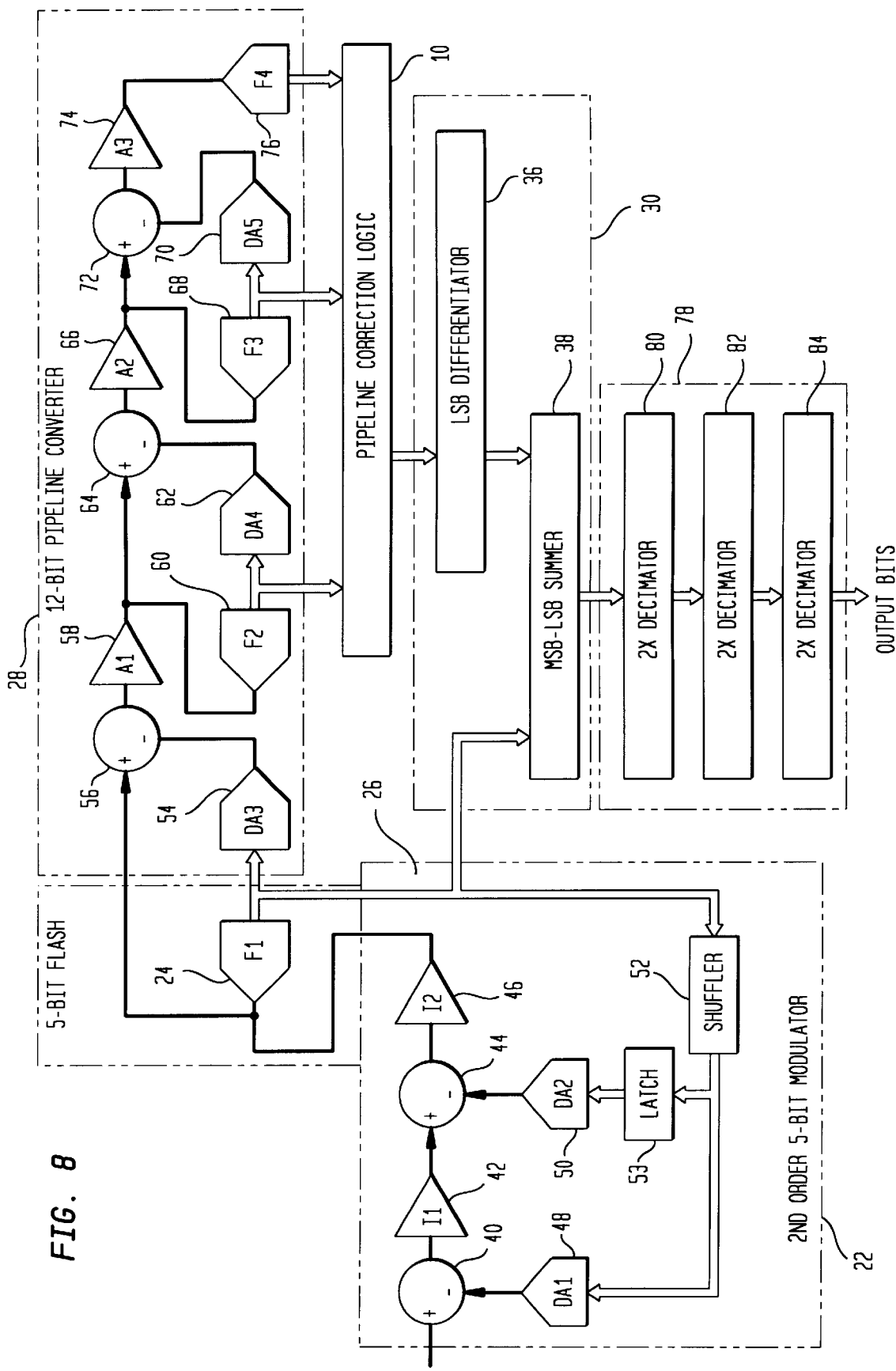
FIG. 8 is an even more detailed block diagram of one embodiment of the ADC system according to the invention.

FIG. 8 is a detailed block diagram of an embodiment of the system of the invention. As shown, the system includes sigma-delta modulator 26, which itself includes SD 22 (having a second-order loop) and 5-bit flash ADC 24. Also included is a 12-bit pipeline ADC 28, in which 5-bit flash 24 comprises a first stage of the pipeline ADC.

Also shown is pipeline correction logic 10, which receives the digital outputs of all stages of the pipeline ADC 28 except for the first stage. The block labeled LSB differentiater 36 is equivalent to digital filter 36 of FIG. 7. The block labeled MSB-LSB summer 38 is equivalent to digital adder 38 of FIG. 7. Also shown is a digital filter 78 which reduces out-of-band quantization noise and typically is employed in sigma-delta modulators. In this embodiment, filter 78 includes three cascaded half-band decimation filters 80, 82 and 84 to provide 8× decimation of digital output data as required with an 8× oversampling ratio. Also shown in sigma-delta modulator 26 is a latch 53 disposed between shuffler 52 and DAC 50.

Having thus described at least one illustrative embodiment of the invention, various alterations, modifications and improvements will readily occur to those skilled in the art. Such alterations, modifications and improvements are intended to be within the spirit and scope of the invention. For example, the transfer functions listed for the filters were exemplary and any transfer function that achieves effective quantization error reduction and/or cancellation is sufficient for use in the systems of the present invention. Accordingly, the foregoing description is by way of example only and is not intended as limiting. The invention is limited only as defined in the following claims and the equivalents thereto.

What is claimed is:

1. An ADC system comprising:
   a sigma-delta modulator that receives an analog input and provides a first digital output and an analog output;
   a non-sigma-delta ADC, coupled to the sigma-delta modulator, that receives the analog output as an input and provides a second digital output; and
   a digital processor, coupled to the sigma-delta modulator and the non-sigma-delta ADC, that receives the first and second digital outputs and provides a digital representation of the analog input.

2. The ADC system as claimed in claim 1 wherein the sigma-delta modulator includes a quantizer ADC.

3. The ADC system as claimed in claim 2 wherein the non-sigma-delta ADC has a throughput delay greater than that of the quantizer ADC.

4. The ADC system as claimed in claim 2 wherein the non-sigma-delta ADC has higher resolution than the quantizer ADC.

5. The ADC system as claimed in claim 1 wherein the non-sigma-delta ADC includes a pipeline ADC.

6. The ADC system as claimed in claim 5 wherein the sigma-delta modulator includes a quantizer ADC which forms a portion of the pipeline ADC.

7. The ADC system as claimed in claim 1 wherein the non-sigma-delta ADC includes a parallel time-interleaved ADC.

8. The ADC system as claimed in claim 7 wherein the sigma-delta modulator includes a quantizer ADC which forms a portion of the parallel time-interleaved ADC.

9. The ADC system as claimed in claim 1 wherein the first digital output is coupled to the digital processor with a delay element.

10. The ADC system as claimed in claim 1 wherein the sigma-delta modulator includes a multi-bit feedback loop.

11. The ADC system as claimed in claim 10 wherein the sigma-delta modulator further includes a digital data scrambler in the multi-bit feedback loop.

12. The ADC system as claimed in claim 1 wherein the digital processor includes a digital combiner that combines two digital signals equal to, or derived from, the first and second digital outputs.

13. The ADC system as claimed in claim 1 wherein the digital processor includes a digital filter having a transfer function with at least one term that approximates an analog transfer function of the sigma-delta modulator.

* * * * *